United States Patent
Thebault et al.

(10) Patent No.: US 7,397,399 B2
(45) Date of Patent: Jul. 8, 2008

(54) METHOD AND DEVICE FOR TRANSCODING N-BIT WORDS INTO M-BIT WORDS WITH M SMALLER N

(75) Inventors: Cédric Thebault, Villingen-Schwenningen (DE); Carlos Correa, Villingen-Schwenningen (DE); Sébastien Weitbruch, Kappel (DE)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/583,428

(22) PCT Filed: Dec. 14, 2004

(86) PCT No.: PCT/EP2004/053447
§ 371 (c)(1),
(2), (4) Date: Jun. 15, 2007

(87) PCT Pub. No.: WO2005/064799
PCT Pub. Date: Jul. 14, 2005

(65) Prior Publication Data
US 2007/0252733 A1    Nov. 1, 2007

(30) Foreign Application Priority Data
Dec. 18, 2003   (EP) ................. 03293224
Mar. 1, 2004    (EP) ................. 04100811

(51) Int. Cl.
*H03M 7/40* (2006.01)
(52) U.S. Cl. .............. 341/67; 341/50; 341/51; 341/95; 708/495; 708/513
(58) Field of Classification Search ........... 341/95; 708/495, 513
See application file for complete search history.

(56) References Cited

U.S. PATENT DOCUMENTS 4,617,641 A * 10/1986 Hamada .............. 708/513

(Continued)

FOREIGN PATENT DOCUMENTS

EP    1256924    11/2002

(Continued)

OTHER PUBLICATIONS

S. Weitbruch et al: "New Metacode Coding Concept for Improving PDP Gray-Scale Quality", Journal of the Society for Information Display, Society for Information Display, San Jose, US, vol.11, No. 3, 2003, pp. 485-491.

(Continued)

*Primary Examiner*—Khai M Nguyen
(74) *Attorney, Agent, or Firm*—Joseph J. Laks; Harvey D. Fried

(57) ABSTRACT

The present invention concerns a method for transcoding a N bits word into a M bits word with M<N. The invention is applicable in various fields and more particularly in the display field. The method comprises the following steps:-breaking down the N bits word into an exponent part and a mantissa part having each a size which varies according to the value of said N bits word, the size of the mantissa part increasing with the value of said N bits word, and -encoding the exponent part of the N bits word into a variable number of bits A and removing, if need be, least significant bits of the mantissa part in order to obtain a mantissa with a variable number of bits B, with A+B=M.

3 Claims, 1 Drawing Sheet

U.S. PATENT DOCUMENTS

| | | | | |
|---|---|---|---|---|
| 4,675,809 A * | 6/1987 | Omoda et al. | ............... | 712/222 |
| 4,758,975 A * | 7/1988 | Omoda et al. | ............... | 708/513 |
| 5,819,017 A * | 10/1998 | Akeley et al. | ............... | 345/422 |
| 6,756,995 B2 * | 6/2004 | Thebault et al. | ............. | 345/690 |
| 6,894,664 B2 * | 5/2005 | Thebault et al. | ............... | 345/60 |
| 6,989,804 B2 * | 1/2006 | Correa et al. | ................. | 345/63 |

FOREIGN PATENT DOCUMENTS

EP        1353314        10/2003

OTHER PUBLICATIONS

Search Report dated May 18, 2005, 3 pages.

* cited by examiner

US 7,397,399 B2

METHOD AND DEVICE FOR TRANSCODING N-BIT WORDS INTO M-BIT WORDS WITH M SMALLER N

This application claims the benefit, under 35 U.S.C. § 365 of International Application PCT/EP2004/053447, filed Dec. 14, 2004, which was published in accordance with PCT Article 21(2) on Jul. 14, 2005 in English and which claims the benefit of European patent application No. 03293224.6 filed Dec. 18, 2003 and European patent application No. 04100811.1 filed March 1, 2004.

The present invention concerns a method for transcoding a N bits word into a M bits word with M<N. The invention is applicable in various fields and more particularly in the display field.

BACKGROUND

Figure 1:
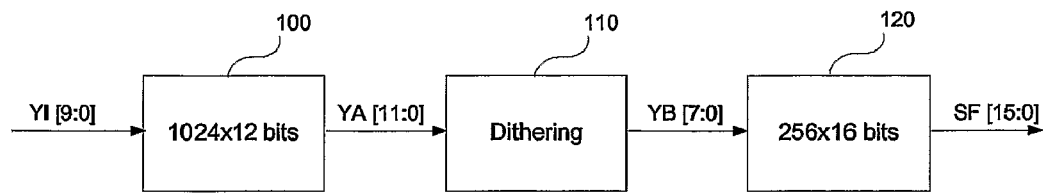

The invention will be described in the field of the plasma display device. The transcoding method is used after a degamma function in a display receiver. FIG. 1 is a standard implementation circuit for encoding video data into subfield data. This circuit comprises a first memory 100 comprising 1024×12 bits for handling 10 bits video data YI[9:0]. A first look up table is stored in the memory 100 and used for remapping these data as described in EP patent application No. 1 353 314 for implementing the metacode concept or in EP patent application No 1 256 954 for implementing a Gravity Center Coding. At the output of the memory 100, 12 bits video signal YA[11:0] is obtained. The available 12-bits correspond to 8-bits integer resolution and 4-bits fractional resolution. Then, the 12-bits of video signal YA [11-0] are forwarded to a dithering circuit 110. In this circuit 110, the 4-bits of fractional resolution are added with the 4-bits of dithering and then truncated.

The video signal YB[7,0] from the circuit 110 is then forwarded to a second memory 120 comprising 256×16 bits. A second look-up table is stored in the memory 120 and is used for transforming the data YB[7:0] into subfield data SF[15:0].

Until now, a degamma function is implemented in the look-up table of the memory 100. Otherwise, in order not to lose significant bits, much more bits (typically 16 bits) would be required after the degamma function than the video input has. So, if the degamma function is made before the memory 100, this memory must have more inputs (16 bits), which will drastically increase the size of this memory. To go from 10 to 16 bits, the size of the memory is multiplied by 64.

And, on another hand, if a user wants to change the value of the degamma, to use a different degamma for each color or to use a specific degamma function, a specific look-up table should be generated for each case (if the degamma function can be known) and all of them should be stored.

For these reasons, it is necessary to separate the degamma function from the look-up table of the memory 100 and to create a transcoding circuit for transcoding 16 bits data (coming for example from a degamma block) into 10 bits data.

An object of the invention is to propose a method for transcoding a 16 bits word into a 10 bits word and, more generally, a method for transcoding a N bits word into a M bits word, N>M.

INVENTION

The invention concerns a method for transcoding a N bits word into a M bits word, N>M, characterized in that it comprises the following steps:

breaking down the N bits word into an exponent part and a mantissa part having each a size which varies according to the value of said N bits word, the size of the mantissa part increasing with the value of said N bits word, and en coding the exponent part of the N bits word into a variable number of bits A and removing, if need be, least significant bits of the mantissa part in order to obtain a mantissa with a variable number of bits B, with A+B=M.

The invention concerns also a device for transcoding a N bits word into a M bits word, N>M, characterized it comprises means for breaking down the N bits word into an exponent part and a mantissa part having each a size which varies according to the value of said N bits word, the size of the mantissa part increasing with the value of said N bits word, and means for encoding the exponent part of the N bits word into a variable number of bits A and removing, if need be, least significant bits of the mantissa part in order to obtain a mantissa with a variable number of bits B, with A+B=M.

It concerns also a Plasma display panel comprising a degamma means for applying a degamma function to video input data and delivering N bits data and a mapping memory for remapping M bits data, with N>M characterized in that it comprises a transcoding device as above.

DRAWINGS

Figure 2:
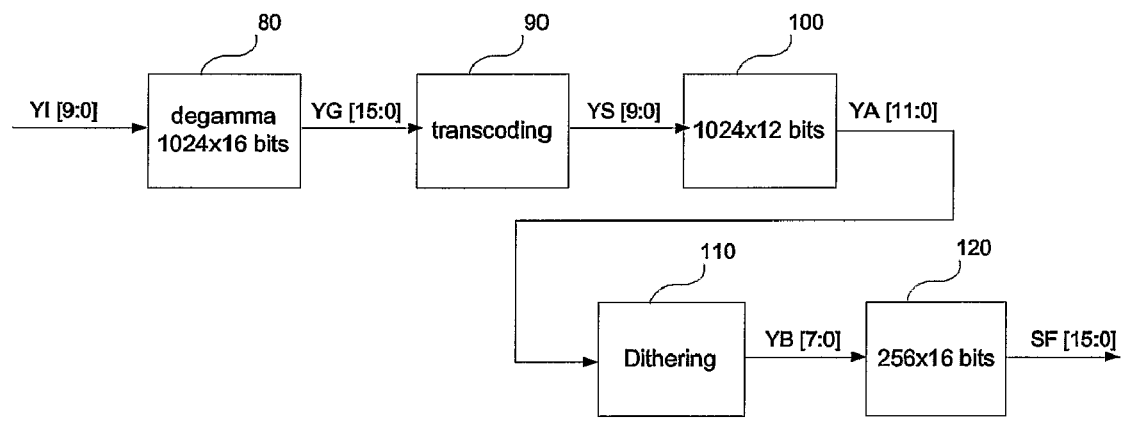

Exemplary embodiments of the invention are illustrated in the drawings and are explained in more detail in the following description, the drawings showing in:

FIG. 1 a block diagram of a standard means for encoding video data into subfield data; and FIG. 2 a block diagram of a means for encoding video data into subfield data with an transcoding block according to the invention;

EXEMPLARY EMBODIMENTS

The method is described for transcoding a 16 bits word into a 10 bits word. As this transcoding method is used for the output of a degamma function, the input values of this transcoding method represent linear video information. So since the eye is less sensitive in the bright levels than in the darks levels, the Least Significant Bits of a 16 bits word representing a high value are not important (and may be even not significant). This means that high values do not require as much precision as low values. On the other hand, the Most Significant Bits of a 16 bits word representing a low level are not necessary since they are all equal zero. This means that low values do not require the 16 bits.

For example, for a 16 bits word, values inferior to 256 do not need more than 8 bits to be encoded without loss of accuracy and values superior to 1024 do not need to have a 1-bit precision. Consequently, some bits of the word could be saved.

According to the invention; each value is defined by a mantissa and an exponent. So, the 10 bit word comprises a mantissa part and an exponent part. The idea of the invention is to use a reduced number of bits for the mantissa.

Basically, it is used 8 bits for the mantissa part, except for the smallest values for which less bits are used. In fact, it is equivalent to use for the mantissa part more bits (up to 16) for the small values and less for the biggest ones (down to 8).

An example of such a conversion is given below. In this example, the 65536 16-bits input values are converted into 1024 output values (10 bits). The 16-bits values can be classified as following:

| | |
|---|---|
| 1XXXXXXXxxxxxxxx | 32768<value<65535 |
| 01XXXXXXXxxxxxxx | 16384<value<32767 |
| 001XXXXXXXxxxxxx | 8162<value<16383 |
| 0001XXXXXXXxxxxx | 4096<value<8161 |
| 00001XXXXXXXxxxx | 2048<value<4095 |
| 000001XXXXXXXxxx | 1024<value<2047 |
| 0000001XXXXXXxxx | 512<value<1023 |
| 00000001XXXXXXxx | 256<value<511 |
| 000000001XXXXXxx | 128<value<255 |
| 0000000001XXXXXx | 64<value<127 |
| 00000000001XXXXX | 32<value<63 |
| 00000000000XXXXX | 0<value<31 |

According to the invention, the small x (symbolizing indifferently zeros or ones) on the right part are lost bits and the zeros and ones on the left side are information which are preserved by an encoding (they are defined by the exponent). The big x (symbolizing indifferently zeros or ones) are bits which are preserved as they are in the 16-bit word.

The transcoding operation can be illustrated by the two following table. The left table corresponds to the 16 bits words and the right table corresponds to the 10 bits words.

| | | |
|---|---|---|
| 1XXXXXXXxxxxxxxx | → | 111XXXXXXX |
| 01XXXXXXXxxxxxxx | → | 110XXXXXXX |
| 001XXXXXXXxxxxxx | → | 101XXXXXXX |
| 0001XXXXXXXxxxxx | → | 100XXXXXXX |
| 00001XXXXXXXxxxx | → | 011XXXXXXX |
| 000001XXXXXXXxxx | → | 010XXXXXXX |
| 0000001XXXXXXxxx | → | 0011XXXXXX |
| 00000001XXXXXXxx | → | 0010XXXXXX |
| 000000001XXXXXxx | → | 00011XXXXX |
| 0000000001XXXXXx | → | 00010XXXXX |
| 00000000001XXXXX | → | 00001XXXXX |
| 00000000000XXXXX | → | 00000XXXXX |

In this example,
the numbers between 32768 and 65535 are encoded with 7 original bits (32768 input values to 128 output values); the mantissa comprises 7 bits and the exponent comprises 3 bits.
the numbers between 16384 and 32767 are encoded with 7 original bits (16384 input values to 128 output values); the mantissa comprises 7 bits and the exponent comprises 3 bits.
the numbers between 8192 and 16383 are encoded with 7 bits (8192 input values to 128 output values); the mantissa comprises 7 bits and the exponent comprises 3 bits.
the numbers between 4096 and 8191 are encoded with 7 original bits (4096 input values to 128 output values); the mantissa comprises 7 bits and the exponent comprises 3 bits.
the numbers between 2048 and 4095 are encoded with 7 original bits (2048 input values to 128 output values); the mantissa comprises 7 bits and the exponent comprises 3 bits.
the numbers between 1024 and 2047 are encoded with 7 original bits (1024 input values to 128 output values); the mantissa comprises 7 bits and the exponent comprises 3 bits.
the numbers between 512 and 1023 are encoded with 6 original bits (512 input values to 64 output values); the mantissa comprises 6 bits and the exponent comprises 4 bits.
the numbers between 256 and 511 are encoded with 6 original bits (256 input values to 64 output values); the mantissa comprises 6 bits and the exponent comprises 4 bits.
the numbers between 128 and 255 are encoded with 5 original bits (128 input values to 32 output values); the mantissa comprises 5 bits and the exponent comprises 5 bits.
the numbers between 64 and 127 are encoded with 5 original bits (64 input values to 32 output values); the mantissa comprises 5 bits and the exponent comprises 5 bits.
the numbers between 32 and 63 are encoded with 5 original bits (32 input values to 32 output values); the mantissa comprises 5 bits and the exponent comprises 5 bits.
the numbers between 0 and 31 are encoded with 5 original bits (32 input values into 32 output values); the mantissa comprises 5 bits and the exponent comprises 5 bits.

This encoding is done with some logic elements as indicated below. In[15:0] is the 16 bits word to be encoded and out [9:0] is the 10 bit word.

```
if(in[15]==1)
    out [9:7]=7
    out [6:0]=in[14:8]
else if (in[14]==1)
    out[9:7]=6
    out[6:0]=in[13:7]
else if (in[13]==1)
    out[9:7]=5
    out[6:0]=in[12:6]
else if (in[12]==1)
    out[9:7]=4
    out[6:0]=in[11:5]
else if (in[11]==1)
    out[9:7]=3
    out[6:0]=in[10:4]
else if (in[10]==1)
    out[9:7]=2
    out[6:0]=in[9:3]
else if (in[9]==1)
    out[9:6]=3
    out[5:0]=in[8:3]
else if (in[8]==1)
    out[9:6]=2
    out[5:0]=in[7:2]
else if (in[7]==1)
    out[9:5]=3
    out[4:0]=in[6:2]
else if (in[6]==1)
    out[9:5]=2
    out[4:0]=in[5:1]
else if (in[5]==1)
    out[9:5]=1
    out[4:0]=in[4:0]
else
    out[9:5]=0
    out[4:0]=in[4:0]
```

This transcoding method is implemented by a transcoding block 90 inserted between a degamma block 80 delivering 16 bits data and the memory 100 as illustrated by FIG. 2. Of course, in this circuit, the look-up table of the memory 100 does not include the degamma function but should include a reverse transcoding of the block 90.

The invention claimed is:
1. Method for transcoding a N bits word into a M bits word, N>M, wherein it comprises the following steps:
breaking down the N bits word into an exponent part and a mantissa part having each a size which varies according to the value of said N bits word, the size of the mantissa part increasing with the value of said N bits word, and
encoding the exponent part of the N bits word into a variable number of bits A and removing, if need be, least significant bits of the mantissa part in order to obtain a mantissa with a variable number of bits B, with A+B=M.

2. Device for transcoding a N bits word into a M bits word, N>M, comprising means for breaking down the N bits word into an exponent part and a mantissa part having each a size which varies according to the value of said N bits word, the size of the mantissa part increasing with the value of said N bits word, and means for encoding the exponent part of the N bits word into a variable number of bits A and removing, if need be, least significant bits of the mantissa part in order to obtain a mantissa with a variable number of bits B, with A+B=M.

3. Plasma display panel comprising:

a degamma means for applying a degamma function to video input data and delivering N bits data;

a transcoding device for transcoding said N bits data into M bits data, with N>M, and a mapping memory for remapping the M bits data, wherein said transcoding device is a transcoding device according to claim 2.

* * * * *